(12) United States Patent
Rottstegge et al.

(10) Patent No.: US 7,033,740 B2
(45) Date of Patent: *Apr. 25, 2006

(54) PHOTORESISTS WITH REACTION ANCHORS FOR CHEMICAL CONSOLIDATION OF RESIST STRUCTURES FOR EXPOSURES AT 157 NM

(75) Inventors: Jörg Rottstegge, Erlangen (DE); Christian Eschbaumer, Schwaig (DE); Christoph Hohle, Bubenreuth (DE); Waltraud Herbst, Uttenreuth (DE)

(73) Assignee: Infineon Technologies AG, Munich (DE)

( * ) Notice: Subject to any disclaimer, the term of this patent is extended or adjusted under 35 U.S.C. 154(b) by 258 days.

This patent is subject to a terminal disclaimer.

(21) Appl. No.: 10/186,657

(22) Filed: Jul. 1, 2002

(65) Prior Publication Data

US 2003/0087182 A1 May 8, 2003

(30) Foreign Application Priority Data

Jun. 29, 2001 (DE) ................ 101 31 670

(51) Int. Cl.
*G03F 7/039* (2006.01)
*G03F 7/20* (2006.01)
*G03F 7/30* (2006.01)
*G03F 7/38* (2006.01)
*G03F 7/40* (2006.01)

(52) U.S. Cl. .................. 430/326; 430/830; 430/311; 430/328

(58) Field of Classification Search ........... 430/270.1, 430/326, 330, 311, 313, 314, 315, 323, 324, 430/905, 907, 910, 914, 328
See application file for complete search history.

(56) References Cited

U.S. PATENT DOCUMENTS

| 5,234,793 A * | 8/1993 | Sebald et al. ............... 430/323 |
| 5,234,794 A * | 8/1993 | Sebald et al. ............... 430/325 |
| 5,250,375 A | 10/1993 | Sebald et al. .................. 430/8 |
| 6,042,991 A * | 3/2000 | Aoai et al. ............... 430/285.1 |
| 6,509,134 B1 * | 1/2003 | Ito et al. .................. 430/270.1 |
| 6,517,993 B1 * | 2/2003 | Nakamura et al. ....... 430/270.1 |
| 6,623,907 B1 * | 9/2003 | Numata et al. .......... 430/270.1 |
| 6,737,215 B1 * | 5/2004 | Dammel et al. ......... 430/270.1 |
| 2003/0073043 A1 * | 4/2003 | Rottstegge et al. ......... 430/322 |

FOREIGN PATENT DOCUMENTS

| EP | 0 492 253 A1 | 7/1992 |
| EP | 1 122 605 A2 | 8/2001 |
| EP | 1 126 322 A2 | 8/2001 |
| JP | 10 239 847 A | 9/1998 |
| WO | 02/084402 A2 | 10/2002 |
| WO | 02/093263 A1 | 11/2002 |

* cited by examiner

*Primary Examiner*—Sin Lee
(74) *Attorney, Agent, or Firm*—Laurence A. Greenberg; Werner H. Stemer; Ralph E. Locher

(57) ABSTRACT

The chemically amplified resist includes a film-forming polymer, a photoacid generator, and a solvent. The film-forming polymer contains acid-labile groups which are eliminated under the action of an acid and liberate a group which brings about an increase in the solubility of the polymer in aqueous alkaline developers. The film-forming polymer has polymer building blocks derived from monomers which are at least monofluorinated and contain an anchor group for the attachment of an amplifying agent. As a result of the fluorination of the polymer building blocks, the transparency of the resist at an exposing wavelength of 157 nm is substantially increased, so that resist structures of increased layer thickness can be represented.

4 Claims, No Drawings

PHOTORESISTS WITH REACTION ANCHORS FOR CHEMICAL CONSOLIDATION OF RESIST STRUCTURES FOR EXPOSURES AT 157 NM

BACKGROUND OF THE INVENTION

Field of the Invention

The invention relates to chemically amplified resists, suitable in particular for exposure using radiation with a wavelength of 157 nm, and to a process for consolidating structures produced from these resists.

Within the semiconductor industry, ever smaller structures and thus an ever increasing density of components on microchips are being realized in shorter and shorter timeframes. This allows processors to achieve higher calculating speeds and memory elements to attain higher capacities, while at the same time the costs of the components can be reduced. The reduction in minimum feature size has been realized in optical lithography by switching to shorter and shorter wavelengths. In order to be able to produce feature sizes in the range from 100 to 70 nm, the development of new processes is needed, since the existing standard processes, based on 193 nm wavelength radiation, are pushing at the boundaries of the realizable resolutions.

In numerous lithographic techniques, photoresists are employed in a wide variety of ways for fabricating microelectronic components. Chemically amplified resists are particularly important. With these resists, exposure triggers a photoreaction which brings about a change in the chemical structure of the photoresist. In the case of positive-working, chemically amplified resists, for example, exposure produces a strong acid which in a subsequent heating step brings about catalytic conversion or cleavage of the resist. Groups in polymers that can be cleaved by strong acids include, for instance, carboxylic tert-butyl esters, which following acid cleavage are in the form of free carboxylic acids. Changing from an apolar group to a strongly polar group causes a drastic alteration in the solubility of the exposed and chemically converted resist in an appropriate developer medium, such as in aqueous basic developers, for instance.

The structured (or patterned) photoresists generally serve as a mask for further processes, such as dry etching processes. Where the photoresist is to structure an underlying organic chemical medium, such as is the case in two-layer resists, then the structured, top photoresist needs to have a high etch resistance in comparison to the medium. Where the etch resistance is not present from the outset, chemical consolidation is required. Since the etch resistance of organosilicon compounds in an oxygen plasma differs markedly from that of organic hydrocarbon compounds, the subsequent incorporation of organosilicon compounds into the resist structures is sensible. The incorporation reaction is often referred to as silylation.

Extensive know how has been acquired in the structuring of microchips by lithographic processes. In order to continue to be able to use this knowledge, work is underway with particular vigor on a design of the known lithographic processes suitable for an exposure wavelength of 157 nm.

One particular difficulty is caused here by the lack of transparency of the materials used to date at a 157 nm exposure wavelength. The aim is for maximum transparency of the base polymer in these high resolution resists, while the photochemicals which are able on exposure to liberate, for example, an acid or a base are required to have a high quantum yield. The transparency of the resist depends heavily on the polymer contained within it. The best polymers currently in use in photoresists achieve an absorption coefficient of around $\mu_{10}=1/\mu m$ at a wavelength of 157 nm. Accordingly, at their exposure wavelength, these polymers still possess absorption which is about 50 times higher than that of polymers which are used for exposures with radiation having a wavelength of 193 or 248 nm. Because of this, it has to date been possible only to produce very thin resist layers, leading to problems with the structuring of the underlying material.

When using radiation having a wavelength of 157 nm with the existing photoresists, it has only been possible to realize layer thicknesses of 50 nm at most, in order to ensure sufficiently high light intensity even in deeper-lying layers of the resist. In spite of the thin layers, the absorption of this resist is so high that in the 50 nm layer only about 40% of the original light intensity reaches the bottommost resist layer. This increases the risk that the resist, following developing, will exhibit what are known as resist feet. The use of such a low layer thickness also harbors other problems. With falling layer thickness, for instance, there is an increase in the defect density in the thin layers. In addition, the low volume of resist material makes the ultrathin resist layers susceptible to contamination. The structures produced with these ultrathin layers at an exposure wavelength of 157 nm therefore have very rough edges and restricted structure resolution.

With these very thin photoresist layers, dry etching must generally be preceded by chemical amplification of the resist, in order to raise the chemical resistance of the resist structure to the oxygen plasma. For this purpose, after structuring, the photoresist is amplified in terms of its etch resistance by the incorporation of groups or molecules, such as organosilicon compounds, and so forms a sufficiently stable etch mask. One drawback of this process is that the reactive anchors, i.e., the bond sites in the molecule which allow attachment of an amplifying agent to the polymer, generally exhibit very high absorption at a wavelength of 157 nm. This is particularly true of anhydride groups, which are used as reactive anchors in the case of consolidation by a silylation reaction. For instance, polymaleic anhydride at 157 nm possesses an absorption coefficient of $\mu_{10}=10.5/\mu m$. Maleic anhydride is used, for example, as a comonomer in the preparation of polymers for photoresists, in order to introduce reactive anchors for liquid silylation into the polymer in the CARL process. Amplification of photoresists by the CARL process is described, for example, in European patent EP 0 395 917 B1. A significant cause of the low transparency of chemically amplified resists at a 157 nm wavelength, therefore, lies in the lack of transparency of the comonomers which carry the reactive anchor for chemical consolidation.

In order to overcome the difficulties depicted, the top surface imaging process was developed. In that process, first of all a relatively thick resist film with low transparency for radiation with a wavelength of 157 nm is exposed. On the surface of the resist layer, reactive groups are formed, such as acidic phenolic hydroxyl groups. In a gas phase silylation, for instance, these groups can be used as reactive groups for incorporating molecules which increase the dry etch resistance. After dry etching, the exposed areas in the resist, amplified by silylation, remain as etched structures. However, even in this case, the existing systems with low transparency have very rough edges.

SUMMARY OF THE INVENTION

It is accordingly an object of the invention to provide a photoresist with reaction anchors for chemical consolidation of resist structures for exposure at 157 nm wavelength light, which overcomes the above-mentioned disadvantages of the heretofore-known devices and methods of this general type and which provides for a chemically amplified resist that exhibits increased transparency at a wavelength of 157 nm and that permits the production of resist structures having a minimum feature size in the range from 70 to 100 nm. The ultimate object is for the resist structures to have a low level of edge roughness.

With the foregoing and other objects in view there is provided, in accordance with the invention, a chemically amplified resist, comprising:

a film-forming polymer containing acid-labile groups, which, on being subjected to an acid, are eliminated and liberate groups that cause an increase in a solubility of the polymer in aqueous alkaline developers;

the polymer comprising a first building block derived from a first monomer that is at least monofluorinated and an anchor group for attachment to an amplifying agent, wherein the anchor group is optionally protected by a protective group;

a photoacid generator; and a solvent.

In other words, the film-forming polymer has acid-labile groups which are eliminated under the action of an acid and liberate groups which bring about an increase in the solubility of the polymer in aqueous alkaline developers. The polymer is formed of first building blocks derived from first monomers which are at least monofluorinated and include an anchor group for the attachment to an amplifying agent. It is possible for the anchor group to be protected by a protective group. The resist further includes a photoacid generator and a solvent.

Through the use of at least partly fluorinated monomers, which also include the anchor group for the attachment of an amplifying agent, the transparency of the resist polymer can be increased significantly. The absorption of the polymer at a wavelength of 157 nm can be lowered by almost 50% as a result of fluorination. Consequently, the allowable layer thickness of the resist can be almost doubled. The increase in layer thickness permits the production of resist structures whose edge roughness is reduced relative to that of the structures obtained with existing photoresists. The greater transparency of the resist leads to structures having vertical sidewalls, and considerably reduced formation of resist feet. As a result of the higher layer thickness of the resist structures, they can also be amplified horizontally by a CARL process, allowing finer resist structures to be reproduced and hence an increase in resolution to be achieved.

The anchor groups present in the monomers allow the resistance of the resist to an oxygen plasma to be increased in a consolidation reaction. For instance, in a silylating reaction, basic amino groups of a silylating agent can be coupled to the anchor groups. As the reaction product it is generally possible to obtain crosslinked resist structures in which the anchor groups of the polymer are linked to the silylating agent by way of acid amides or as ammonium salts, for example. The silylation takes place preferably with a solution of the amplifying agent.

Film-forming polymers which can be used are all polymers which on the one hand include the at least partly fluorinated polymer building block (monomer unit) with the anchor group for the attachment of an amplifying agent and on the other hand, within the chain or pendantly, contain acid-labile groups of low alkali solubility which produce alkali-soluble groups on the polymer through the catalytic action of a strong acid, where appropriate with temperature treatment at the same time. Alkali-soluble groups of this kind are mostly polar groups, such as a carboxyl group or an acidic hydroxyl group, for example. In preparing the polymer for the photoresist of the invention, therefore, it is possible to employ the known photoresist polymers, with appropriate modification of the monomers by which the anchor groups are introduced into the polymer. The other monomers customary for preparing the known polymers can be adopted. Examples of acid-labile groups include the following: tert-alkyl ester, tert-butyl ester, tert-butoxycarbonyloxy, tetrahydrofuranyloxy, tetrahydropyranyloxy, and acetal groups. Tert-butyl ester groups are particularly preferred. In one preferred embodiment of the invention the acid-labile groups are attached to groups in the polymer which bring about increased transparency of the polymer, and hence of the resist layer, to light with a very short wavelength of, for example, 157 nm. Suitable for example are fluorinated groups which include acidic alcohol groups, the hydroxyl function being protected by a tert-butyl ether, tert-butoxycarbonyloxy, tetrahydrofuranyl, tetrahydropyranyl or acetal radical or by another acid-eliminable radical. Following elimination of the acid-labile groups, the acidic hydroxyl groups can be silylated, for example, by means of appropriate consolidating agents. Examples of groups which in the polymer contain acidic hydroxyl groups are depicted below.

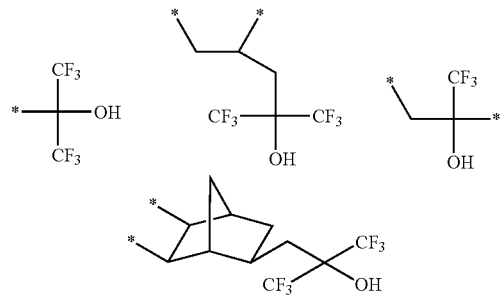

As photoacid generators it is possible to use all compounds which liberate acid on irradiation. Preference is given to using ionic compounds in the form of sulfonium salts and iodonium salts as photoacid generators. Suitable examples include onium compounds, as described in a commonly assigned earlier application Ser. No. 09/307,827 and German patent document DE 19820477.

Suitable anchor groups for the attachment of an amplifying agent include, for example, carboxyl groups, acidic hydroxyl groups, and acid anhydride groups. The carboxyl groups in the acidic hydroxyl groups may be protected, for example, with the acid-labile groups mentioned above.

Examples of solvents which can be used for photoresists include methoxypropyl acetate, oligoethylene glycol ether, cyclopentanone, cyclohexanone, γ-butyrolactone, and ethyl lactate. Mixtures of at least two of these solvents can also be used. In general, it is possible to use any common photoresist solvents or mixtures thereof provided they allow the preparation of a clear, homogeneous, and storage-stable solution of the resist components and that good layer quality of the resist film is obtained when a substrate is coated.

The components described so far are used preferably in the following proportions in the resist of the invention:

film-forming polymer: from 1 to 50% by weight, preferably from 2 to 8% by weight;

photoacid generator: from 0.01 to 10% by weight, preferably from 0.1 to 1% by weight;

solvent: from 50 to 99% by weight, preferably from 92 to 97% by weight.

Besides the above-mentioned ingredients, the chemically amplified resist may comprise further customary ingredients. For example, there may be a thermoacid generator which liberates an acid on heating. The temperature at which the thermoacid generator liberates an acid must be above the temperature at which the acid-labile groups are eliminated in the exposed areas of the photoresist. The thermoacid generator is generally present in the photoresist in a fraction of from 0.01 to 5% by weight, preferably from 0.05 to 1% by weight.

Examples of suitable thermoacid generators are benzylthiolanium compounds. Using the thermoacid generator, the acid-labile groups can be eliminated by heating in the structured resist and, consequently, polar groups can be liberated which act as anchor groups for the attachment of the amplifying agent.

In addition, further components may be added as additives to the photoresist, influencing the resist system advantageously in respect of resolution, film-forming properties, storage stability, radiation sensitivity, service life effects, etc.

The anchor group to which the amplifying agent is attached must possess sufficient reactivity to allow attachment of the amplifying agent to it within acceptable process times.

In a first preferred embodiment, the first monomer, which introduces the anchor group into the polymer, includes an acid anhydride group. In the polymer, the acid anhydride group may act as an anchor group to which, for instance, a basic amino group of a silylating reagent can be attached via an acid amide group.

A suitable monomer may be selected from a group consisting of monofluorinated or polyfluorinated maleic anhydride, monofluorinated or polyfluorinated itaconic anhydride, monofluorinated or polyfluorinated cyclohexenedicarboxylic anhydride, monofluorinated or polyfluorinated norbornenedicarboxylic anhydride, and monofluorinated or polyfluorinated methacrylic anhydride. Of these monomers, the perfluorinated compounds are particularly preferred The monomers may also carry further substituents, such as alkyl groups having from 1 to 10 carbons, which may also be partly or fully fluorinated.

The polymers are prepared, for example, by free-radical polymerization. The polymers can comprise the following polymer building blocks (monomer units), each possessing an acid anhydride group as an anchor group for the attachment of an amplifying agent.

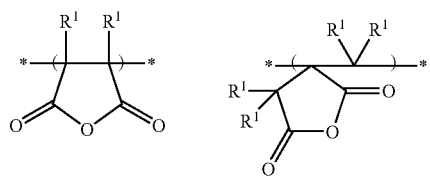

-continued

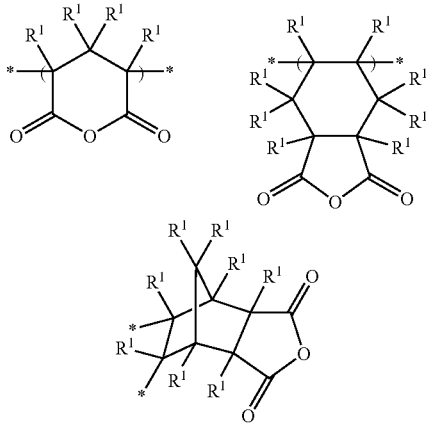

where each $R^1$ independently at each position can be hydrogen or fluorine or an alkyl radical having from 1 to 10 carbon atoms, it being possible for the alkyl radical to be monofluorinated or polyfluorinated, and it is preferably perfluorinated, and in each monomer unit at least one $R^1$ stands for fluorine. The film-forming polymer may also comprise two or more of the monomer units indicated.

In a second preferred embodiment, the monomer includes a carboxyl group. In film-forming polymers the carboxyl group acts as an anchor group for the attachment of an amplifying agent. In the monomer, the carboxyl group is preferably not in the form of a free carboxyl group but is instead esterified by an acid-labile protective group. Examples of acid-labile protective groups which can be used include the acid-labile groups mentioned above.

The monomer is preferably selected from the group consisting of monofluorinated or polyfluorinated methacrylic acid, monofluorinated or polyfluorinated acrylic acid, monofluorinated or polyfluorinated cyclohexenecarboxylic acid, and monofluorinated or polyfluorinated norbornenecarboxylic acid, it also being possible for the carboxyl group of the acids to be esterified with a protective group, especially an acid-labile protective group.

From the monomers used with preference, which may also be further substituted, the monomer units shown below, for example, are obtained.

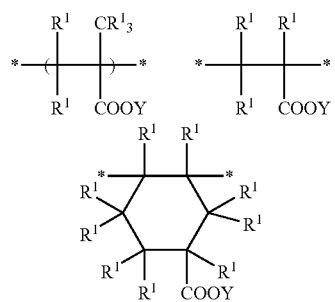

In these units, each $R^1$ independently at each position stands for a hydrogen or fluorine atom, or for an alkyl group having from 1 to 10 carbon atoms, which may also be fully or partly fluorinated, with at least one $R^1$ in each monomer unit standing for a fluorine atom. Y stands for a hydrogen atom or an acid-labile protective group. The film-forming polymers may also comprise two or more of the monomer units shown. It is also possible for monomer units of the first preferred embodiment to be combined with monomer units of the second preferred embodiment. The acting anchor group, where appropriate following elimination of the acid-labile protective group, is the carboxyl group. The attachment of a silylating reagent containing a basic amino group in this case takes place by way of an acid amide bond or in the form of an ammonium salt.

In a third preferred embodiment, the monomer includes two or more carboxyl groups. In that case at least one of the carboxyl groups acts as an anchor group for the attachment of the amplifying agent. Where the amplifying agent used is, for example, a silylating agent containing a basic amino group, attachment can take place in a neutralization reaction, taking the form of salt formation, for example. Covalent attachment is also possible. The carboxyl groups may also be present in a protected form, with at least one of the carboxyl groups esterified with an acid-labile protective group. Once again, the acid-labile protective groups already mentioned above can be used.

With preference, the monomer comprising two or more carboxyl groups is selected from a group consisting of monofluorinated or polyfluorinated maleic acid, monofluorinated or polyfluorinated itaconic acid, monofluorinated or polyfluorinated cyclohexenedicarboxylic acid, and monofluorinated or polyfluorinated norbornenedicarboxylic acid, it being possible for one or both carboxyl groups to be esterified with a protective group, especially an acid-labile protective group. The perfluorinated monomers are preferred for the preparation of the film-forming polymer.

The abovementioned monomers lead, for example, to monomer units having the following structure:

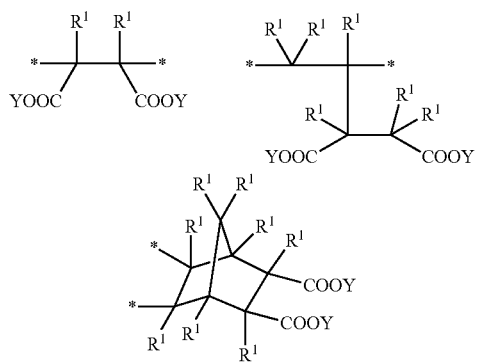

where $R^1$ independently at each position stands for a hydrogen atom or a fluorine atom, or for an alkyl group having from 1 to 10 carbon atoms, which may also be partly or fully fluorinated, and in each monomer unit at least one $R^1$ stands for a fluorine atom. Y stands in each case for a hydrogen atom or an acid-labile protective group. The film-forming polymer may also include two or more of the monomer units shown. Likewise possible is a combination with the monomer units described in connection with the first or second preferred embodiment.

Among the monomers of the first to third preferred embodiments, particular preference is given to those monomers of the first embodiment that contain a carboxylic anhydride group.

Besides the fluorine-containing monomer units shown, the film-forming polymer may also include at least one further monomer unit, preferably containing a group which allows the polymer to be modified by reaction with a modifying reagent. In this context, recourse may be had to the modifying reagents and monomer units that are customary for photoresist polymers.

Examples of further monomers which can be used include acrylic acid and/or methacrylic acid, in which case preference is given to using the alkyl esters of these acids, especially the $C_1$ to $C_{12}$ alkyl esters, an example being tert-butyl methacrylate. The further monomer unit may also be obtained from a silicon-containing monomer, such as allyltrimethylsilane.

Structures of further monomer units which may be present in the film-forming polymer are depicted below. This recitation, however, merely shows a number of preferred examples and should not be interpreted as being conclusive.

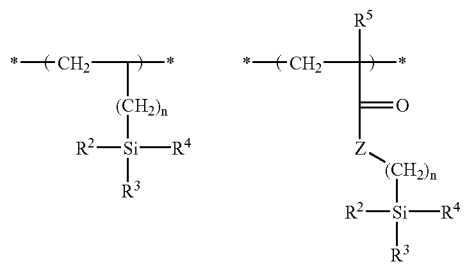

$R^2$ to $R^4$ here may independently of one another be $C_1$ to $C_6$ alkyl or $C_1$ to $C_6$ alkoxy, $C_6$ to $C_{18}$ aryl or $C_6$ to $C_{18}$ aryloxy or aralkyl having a $C_6$ to $C_{18}$ alkyl group and a $C_1$ to $C_4$ alkylene radical; $R^5$ can be H or $C_1$ to $C_6$ alkyl; n can be an integer between 0 and 3, and z can be O or NH.

The photoresist of the invention permits the structuring of resists on exposure at a wavelength of 157 nm. Because of the heightened transparency of the resist, films of greater thickness can be used. The polymer contains anchor groups for the attachment of an amplifying agent. The invention therefore further provides a process for consolidating resist structures which comprises the following steps:

(a) applying the above-described resist to a substrate;
(b) drying the resist to give a dried resist;
(c) exposing the dried resist to give an exposed resist which contains a latent image;
(d) heating the exposed resist to a first temperature, the latent image being transformed into a chemical profile, and polar groups being liberated on the polymer;
(e) developing the resist with an aqueous-alkaline developer, areas of the chemical profile which contain polar groups of the polymer being detached from the substrate, to give a structured resist;
(f) if appropriate, liberating the anchor groups from the protected anchor groups;
(g) applying an amplifying agent to the structured resist; and
(h) washing off excess amplifying agent.

The resist is applied to the substrate by conventional techniques, such as by spin coating or spraying. The substrate used is generally a silicon wafer, which may already have passed through structuring steps and may therefore already include structures or microelectronic components. In this case it is also possible first to apply a bottom resist so as to be able to compensate unevenesses on the surface of the substrate and to ensure reliable focusing of the exposing radiation in the layer of the resist of the invention. Following removal of the solvent by drying, the dried resist layer is exposed. As a result of exposure, the photoacid generator releases a proton, which in the exposed areas leads to elimination of the acid-labile protective groups. The acid initially forms a latent image, i.e., the distribution of the acid in the photoresist corresponds to the exposed areas. As a result of the elimination of the acid-labile groups, polar groups are liberated on the polymer and the latent acid image is impressed into the polymer. The polymer undergoes a change in its chemical nature, i.e., areas are formed in the resist in which the polymer exhibits an increased polarity. Over the area of the photoresist, therefore, a chemical profile is produced. Heating the resist accelerates elimination of the acid-labile groups. Since the proton acts as a catalyst to the elimination of the acid-labile protective groups, one released proton can be used to eliminate a multiplicity of acid-labile protective groups. This leads to greater contrasting of the latent image produced by exposure. As a result of the elimination of the acid-labile protective groups, alkali-soluble groups are liberated, such as carboxyl groups or acidic hydroxyl groups. Because of the elimination of the acid-labile protective groups there is a difference in the solubility of the polymer in alkaline aqueous developers between the exposed and unexposed areas. If, therefore, the resist is treated with an alkaline-aqueous developer agent, such as tetramethylammonium hydroxide, only the exposed areas are detached from the substrate. A structured resist is then obtained on the substrate. This resist can subsequently be altered in its properties, such as in its etch resistance toward an oxygen plasma, by treatment with an amplifying agent. If the anchor groups are already present in a reactive form in the polymer, as carboxylic anhydride groups, for example, a solution of the amplifying agent can be applied directly to the already structured resist. Where the anchor groups are in protected form, they are first of all liberated. This can be done, for example, by subjecting the structured resist to flood exposure and subsequent heating. In this case the polar groups are now liberated in the unexposed areas of the photoresist as well, and then act as anchor groups for the attachment of the amplifying agent. Examples of amplifying agents which can be used include aromatic compounds, resulting in an increase in layer thickness, thereby prolonging the time until the resist structure is ablated in an etch plasma. As an alternative, silicon-containing amplifying agents can be used. In an oxygen plasma an $SiO_2$ film is then produced which protects the underlying resist layers from ablation by the oxygen plasma.

The amplifying agent may be applied from the gas phase or else in solution in an appropriate solvent to the structured resist.

Basic silylating reagents which are suitable include amino-functionalized organosilicon compounds, such as aminosiloxanes. Particularly suitable, for example, are catenated dimethylsiloxanes containing terminal aminopropyl units and from 1 to 50, preferably from 2 to 12, silicon atoms per molecule. Such amplifying agents are represented, for example, by the following general structural formulae:

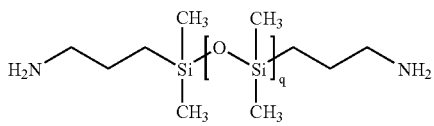

where q=0–49.

Further examples of amplifying agents containing amino-functional groups, and also other functional groups, are depicted below:

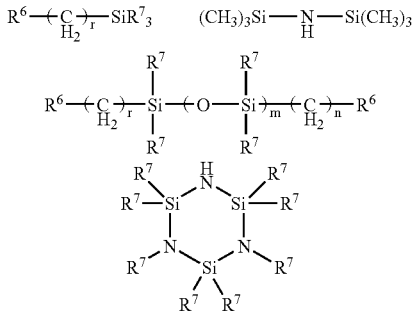

where m is an integer between 0 and 30, r is an integer between 0 and 10, $R^7$ is H, alkyl, aryl, cycloalkyl, and $R^6$ is

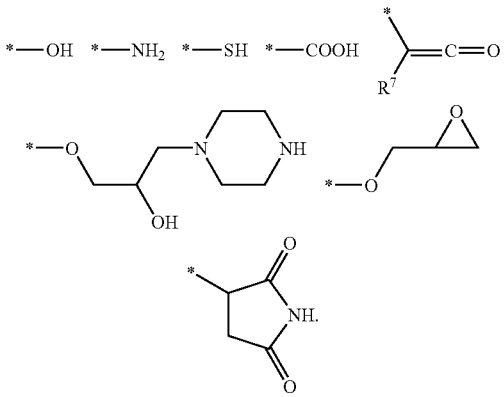

Silsesquioxanes are further suitable amplifying agents.

Where the amplifying agent is applied in solution to the resist, examples of suitable solvents include hexanol, isopropanol, heptane, decane, or a mixture of at least two of these solvents. In general, however, it is possible to use any common nonacidic or basic solvents, or mixtures thereof, which are capable of taking up the components of the amplifying agent in a clear, homogeneous, and storage-stable solution.

The reaction of the amplifying agent with the anchor groups of the film-forming monomer can be enhanced by reaction accelerators. Suitable reaction accelerators for the silylation, for swelling and stabilizing the reaction products, include water, alcohols of low molecular mass, such as methanol or ethanol, and aldehydes and ketones of low molecular mass, such as acetone.

The photoresist of the invention permits structuring by exposure to radiation of a wavelength which is shorter than the wavelengths used to date in fabrication. The resist is therefore preferably exposed using radiation with a wavelength of less than 200 nm, preferably 193 nm, and with particular preference 157 nm.

The invention is illustrated with reference to an example.

A copolymer is prepared by free-radical polymerization from 50 mol % tert-butyl methacrylate and 50 mol % trifluoromethacrylic acid as reaction anchor, and the absorption coefficient is measured in comparison to an analogous, nonfluorinated copolymer. The nonfluorinated copolymer is found to have an absorption coefficient of about 7.0/μm, whereas in the fluorinated copolymer the absorption coefficient is reduced to 4.0/μm. Accordingly, layer thicknesses higher by a factor of about 1.7, and up to 85 nm, can be obtained with the fluorinated resist polymer as compared with its nonfluorinated counterpart. In particular, the partial fluorination of methacrylic acid as a reaction anchor for the silylation lowers the absorption of the polymer decisively.

We claim:

1. A process for consolidating resist structures, which comprises the following method steps:

applying a resist to a substrate, said resist being a chemically amplified resist, including:

a film-forming polymer having a first monomer and a second monomer, and wherein:

said first monomer is at least monofluorinated and contains an anchor group for attachment to an amplifying agent;

said first monomer is selected from the group consisting of monofluorinated or polyfluorinated maleic anhydride, monofluorinated or polyfluorinated itaconic anhydride, monofluorinated or polyfluorinated cyclohexenedi-carboxylic anhydride and monofluorinated or polyfluorinated methacrylic anhydride; and said second monomer contains acid-labile groups producing alkaline-soluble groups in said polymer through catalytic action of a strong acid;

a photoacid generator; and a solvent;

drying the resist to form a dried resist;

exposing with radiation having a wavelength of less than 200 nm the dried resist to form an exposed resist containing a latent image;

heating the exposed resist to a first temperature, to thereby transform the latent image into a chemical profile, and liberating polar groups on the polymer;

developing the resist with an aqueous alkaline developer, to detach areas of the chemical profile containing polar groups of the polymer from the substrate, to form a structured resist;

applying an amplifying agent to the structured resist; and washing off excessive amplifying agent.

2. The process according to claim 1, wherein the amplifying agent is a silicon-containing compound.

3. The process according to claim 1, wherein the amplifying agent is applied in solution.

4. The process according to claim 1, which comprises exposing with radiation having a wavelength of 157 nm.

* * * * *